(12) United States Patent
Sopko et al.

(10) Patent No.: US 8,909,850 B2
(45) Date of Patent: Dec. 9, 2014

(54) MEMORY LIFE EXTENSION METHOD AND APPARATUS

(75) Inventors: Tyge Sopko, Dubuque, IA (US); Zimin W. Vilar, Dubuque, IA (US); Alan K. Gilman, West Fargo, ND (US)

(73) Assignee: Deere & Company, Moline, IL (US)

( * ) Notice: Subject to any disclaimer, the term of this patent is extended or adjusted under 35 U.S.C. 154(b) by 457 days.

(21) Appl. No.: 13/044,614

(22) Filed: Mar. 10, 2011

(65) Prior Publication Data

US 2012/0232744 A1    Sep. 13, 2012

(51) Int. Cl.
| | |
|---|---|
| *G06F 12/16* | (2006.01) |
| *G06F 17/00* | (2006.01) |
| *G11C 16/10* | (2006.01) |
| *G06F 13/16* | (2006.01) |
| *G11C 16/34* | (2006.01) |
| *B65D 49/00* | (2006.01) |
| *B65D 65/00* | (2006.01) |

(52) U.S. Cl.
CPC ............... *G06F 12/16* (2013.01); *G06F 13/16* (2013.01); *G11C 16/3495* (2013.01)
USPC .................... 711/103; 711/154; 711/E12.008; 707/687

(58) Field of Classification Search
None
See application file for complete search history.

(56) References Cited

U.S. PATENT DOCUMENTS

| | | | |
|---|---|---|---|
| 4,699,239 A * | 10/1987 | Ishino et al. ...................... 701/50 |
| 4,771,851 A * | 9/1988 | Nystuen et al. ................ 180/419 |
| 5,485,595 A | 1/1996 | Assar et al. | |
| 5,889,939 A | 3/1999 | Iida | |
| 5,905,993 A | 5/1999 | Shinohara | |
| 6,049,856 A * | 4/2000 | Bolyn ........................... 711/168 |
| 7,865,761 B1 * | 1/2011 | Chilton ......................... 711/103 |
| 7,913,032 B1 * | 3/2011 | Cornwell et al. ............. 711/103 |
| 7,915,172 B2 * | 3/2011 | Yaegashi ....................... 257/295 |
| 8,261,133 B1 * | 9/2012 | Ali-Santosa et al. ........... 714/54 |
| 2003/0149833 A1 * | 8/2003 | Hamlin ......................... 711/104 |
| 2004/0139282 A1 * | 7/2004 | Yoshioka et al. .............. 711/133 |
| 2005/0055495 A1 * | 3/2005 | Vihmalo et al. .............. 711/103 |
| 2005/0273642 A1 | 12/2005 | Moore | |
| 2006/0044868 A1 * | 3/2006 | Swanson ....................... 365/171 |
| 2006/0092003 A1 * | 5/2006 | Gardner ........................ 340/431 |
| 2007/0005627 A1 * | 1/2007 | Dodge .......................... 707/101 |
| 2007/0014160 A1 * | 1/2007 | Kobernik et al. ........ 365/185.23 |
| 2007/0033364 A1 * | 2/2007 | Maeda et al. .................. 711/170 |
| 2007/0055833 A1 * | 3/2007 | Vu et al. ........................ 711/162 |
| 2007/0061507 A1 * | 3/2007 | Iwanari et al. ................ 711/107 |
| 2008/0071972 A1 * | 3/2008 | Kimura ......................... 711/103 |
| 2008/0244165 A1 * | 10/2008 | Kunimatsu .................... 711/103 |
| 2008/0307152 A1 * | 12/2008 | Nakanishi et al. ............. 711/102 |

(Continued)

OTHER PUBLICATIONS

German Search Report in counterpart German Patent Application No. 102012203713.6 (5 pages) (Apr. 8, 2013).

(Continued)

*Primary Examiner* — Daniel J Bernard
(74) *Attorney, Agent, or Firm* — Quarles & Brady LLP

(57) ABSTRACT

A memory management method including the steps of storing a value and writing data. The storing a value step stores a value representative of a number of erase/write cycles that a subset of memory space of a first memory has undergone. The first memory having an assigned predetermined maximum number of erase/write cycles. The writing data step writes data to the subset of memory space dependent upon whether the value is below the predetermined maximum number.

7 Claims, 6 Drawing Sheets

(56) References Cited

U.S. PATENT DOCUMENTS

| | | | |
|---|---|---|---|
| 2009/0144501 A2* | 6/2009 | Yim et al. | 711/120 |
| 2010/0037001 A1* | 2/2010 | Langlois et al. | 711/103 |
| 2010/0082890 A1* | 4/2010 | Heo et al. | 711/103 |
| 2010/0172179 A1* | 7/2010 | Gorobets et al. | 365/200 |
| 2010/0293323 A1* | 11/2010 | Jeon et al. | 711/103 |
| 2010/0307219 A1* | 12/2010 | Fackler et al. | 73/1.16 |
| 2011/0283066 A1* | 11/2011 | Kurashige | 711/118 |
| 2012/0117304 A1* | 5/2012 | Worthington et al. | 711/103 |
| 2012/0137087 A1* | 5/2012 | Umimura | 711/154 |

OTHER PUBLICATIONS

Coughlin, Thomas M.: Digital Storage in Consumer Electronics—The Essential Guide. Embedded Technology. Amsterdam: Newnes, 2008.

AEC—Q100-005—Rev-D1, Non-Volatile Memory Program/Erase Endurance, Data Retention, and Operating Life Test, Jan. 9, 2012.

AEC—Q100—Rev-G, Failure Mechanism Based Stress Test Qualification for Integrated Circuits, May 14, 2007.

\* cited by examiner

MEMORY LIFE EXTENSION METHOD AND APPARATUS

FIELD OF THE INVENTION

The present invention relates to memory life extending method, and, more particularly, to a memory life extending method for use with a memory having a limited write endurance.

BACKGROUND OF THE INVENTION

Data storage and management is often a combination of compromises on embedded platforms due to the overhead associated with the managing of the file systems, files, sector verification, low-level device interaction, and the like, which is typically associated with portable electronics. To illustrate a common scenario where this complexity is necessary, consider the example of FIG. 1, in which a digital camera is compared to a personal computer. To meet the packaging and power requirements, the digital camera has hardware and software specifications that are significantly lower than the general-purpose computer. The processor is specialized, and mass storage only exists in the form of a removable flash device or card, random access memory (RAM) is almost nonexistent, and I/O is greatly reduced and highly specialized to match its specific purposes.

This hypothetical camera has dedicated software designed to manage the flash storage device. Since the flash storage device can be connected directly to the personal computer, it has to use the same high-level file management as the personal computer. That is, the camera must understand the filing system, allocation tables, sector testing, files that are split across sectors, and so on, on top of the need to provide low-level I/O.

In stark contrast, vehicles, such as construction vehicles or agricultural vehicles, may utilize an embedded controller. The embedded controller has very minimal controller resources due to cost considerations. It is not feasible to have a sophisticated filing system for storage of data. In a typical storage system, no high-level filing system is utilized and the memory devices are addressed directly and efficiently. Compared against the aforementioned digital camera, the embedded controllers of a vehicle serve as data logging devices with very different goals and interfaces. Concerning vehicles, there is a need to store operational data on the functioning of the vehicle in nonvolatile storage. The data is maintained in RAM as a normal controller operation and written into nonvolatile flash memory at power down to permanently commit the data to storage. With no filing system requirement, the flash device is addressed directly and efficiently.

Flash memory is typically accessible by sectors, with sector sizes dependent upon the size of the device. For example, a 32 MB flash memory may have a 32 kB sector size, a 4 GB flash memory may have a 256 kB sector size. To change any byte in the sector typically necessitates an erase/write cycle on that entire sector. A problem exists in that flash memory technology is only capable of a defined number, such as 100,000 erase/write (E/W) cycles per sector prior to sector failure. Consumer electronics are designed with this constraint and have file management capabilities to test and avoid bad sectors that have been exhausted. Further, secondary shadow RAM attempts to minimize the number of E/W cycles to the various sectors and will only commit an erase/write cycle if numerous changes are requested for a shadowed flash sector. For example, if a single shadowed sector is getting thousands of hits in shadow RAM, the write to memory will not be committed until the algorithm determines swapping shadowed sectors will result in minimum impact to the device. Over time, device capacity may or may not diminish as a result of exhausted sectors, depending on the device algorithm.

Different nonvolatile storage technologies, such as ferroelectric random access memory (FRAM) or magnetoresistive random access memory (MRAM) have E/W cycles an order of magnitude greater than flash memory, but typically have storage capacities that are five or more magnitudes smaller. The limited capacity of these memories render these technologies useless for high volume storage despite their increased device longevity.

FRAM has the same functionality as flash memory, even having lower power usage and faster write performance and much greater maximum number of E/W cycles. FRAM disadvantages are that there are much lower storage densities than flash memory devices, storage capacity limitations, and higher cost involved with FRAM technology.

What is needed in the art is the mass storage capacity of flash memory and its lower cost with the higher E/W cycle performance of the FRAM technology so that it can be cost effectively utilized in applications using memory.

SUMMARY

The invention provides a method for extending the life of a data storage device, particularly for use in a vehicular application.

The invention, in one form thereof, is directed to a memory management method including the steps of storing a value and writing data. The storing a value step stores a value representative of a number of erase/write cycles that a subset of memory space of a first memory has undergone. The first memory having an assigned predetermined maximum number of erase/write cycles. The writing data step writes data to the subset of memory space dependent upon whether the value is below the predetermined maximum number.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplifications set out herein illustrate one embodiment of the invention and such exemplifications are not to be construed as limiting the scope of the invention in any manner.

DETAILED DESCRIPTION

Figure 1:
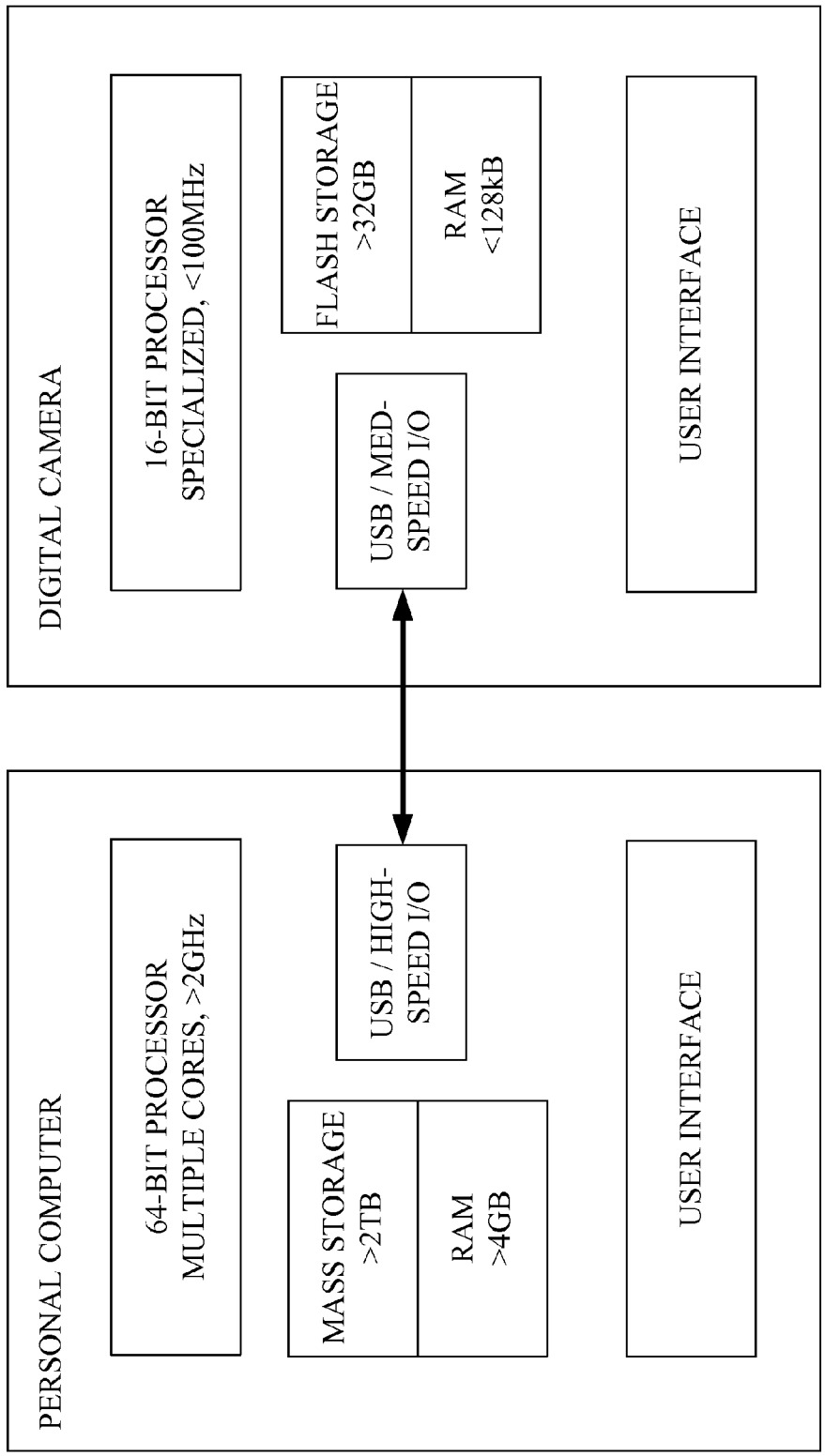
FIG. 1 is a prior art illustration of memory usage in a personal computer and a digital camera.
Figure 2:
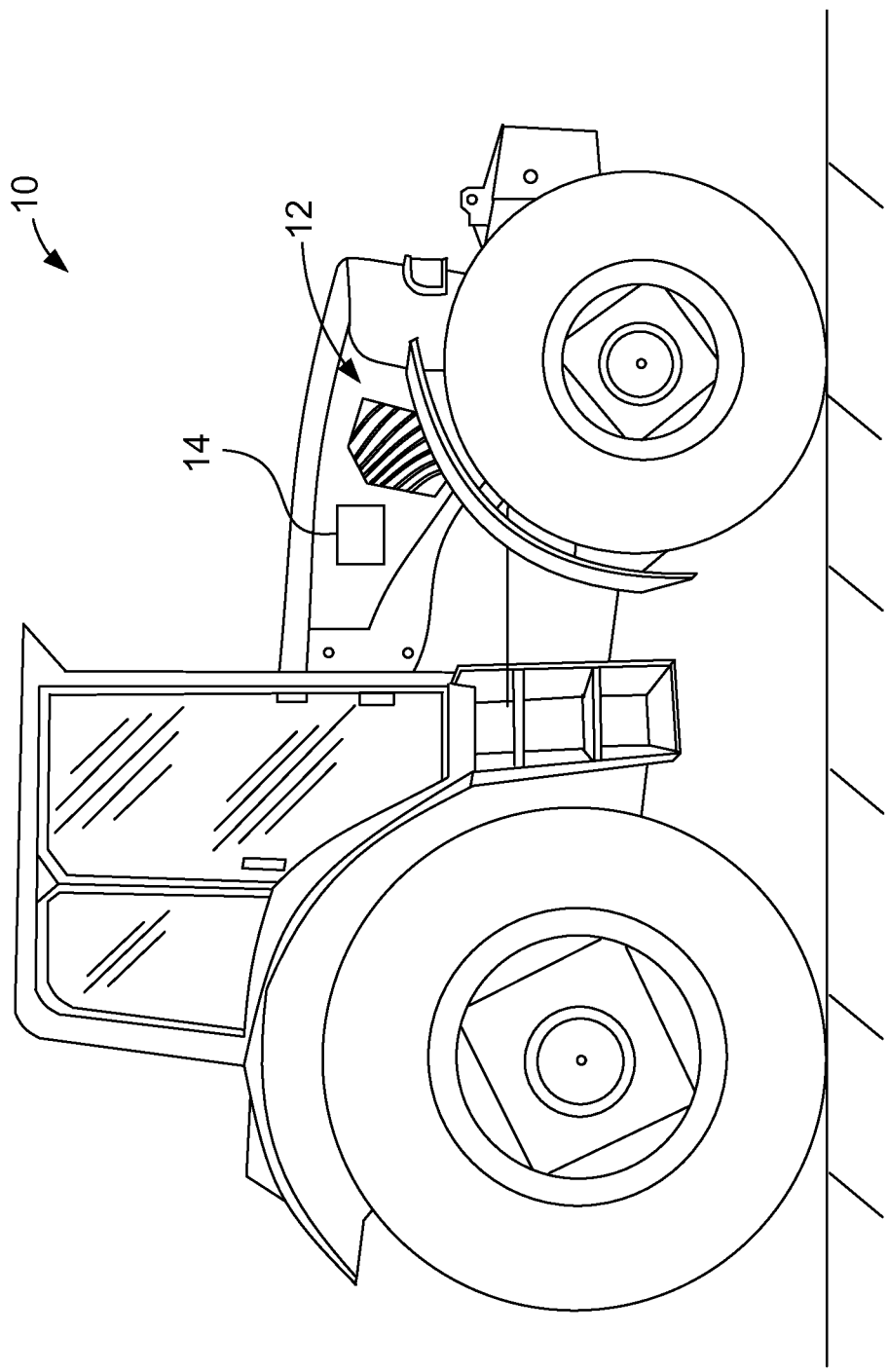
FIG. 2 is a side view of an agricultural vehicle utilizing an embodiment of a memory extending method of the present invention.

Referring now to the drawings, and more particularly to FIG. 2, there is illustrated a vehicle 10, which may be in the form of an agricultural vehicle having an energy consuming device 12 and a control unit 14. Energy consuming device 12 provides motive power for vehicle 10 allowing vehicle 10 to move and perform various actions of motion of the vehicle as a whole and regarding mechanisms thereof. Energy consuming device 12 may be in the form of an internal combustion engine, such as a diesel engine with control unit 14 being embedded therein in the form of an engine control unit. Control unit 14 is part of an electrical control system that is part of energy consuming device 12 as well as being a part of vehicle 10. Several performance measuring devices in the form of sensors are connected to energy consuming device 12, which produce measured values associated with performance attributes of energy consuming device 12. The measured values are stored by control unit 14 for prognostic use.

Figure 3:
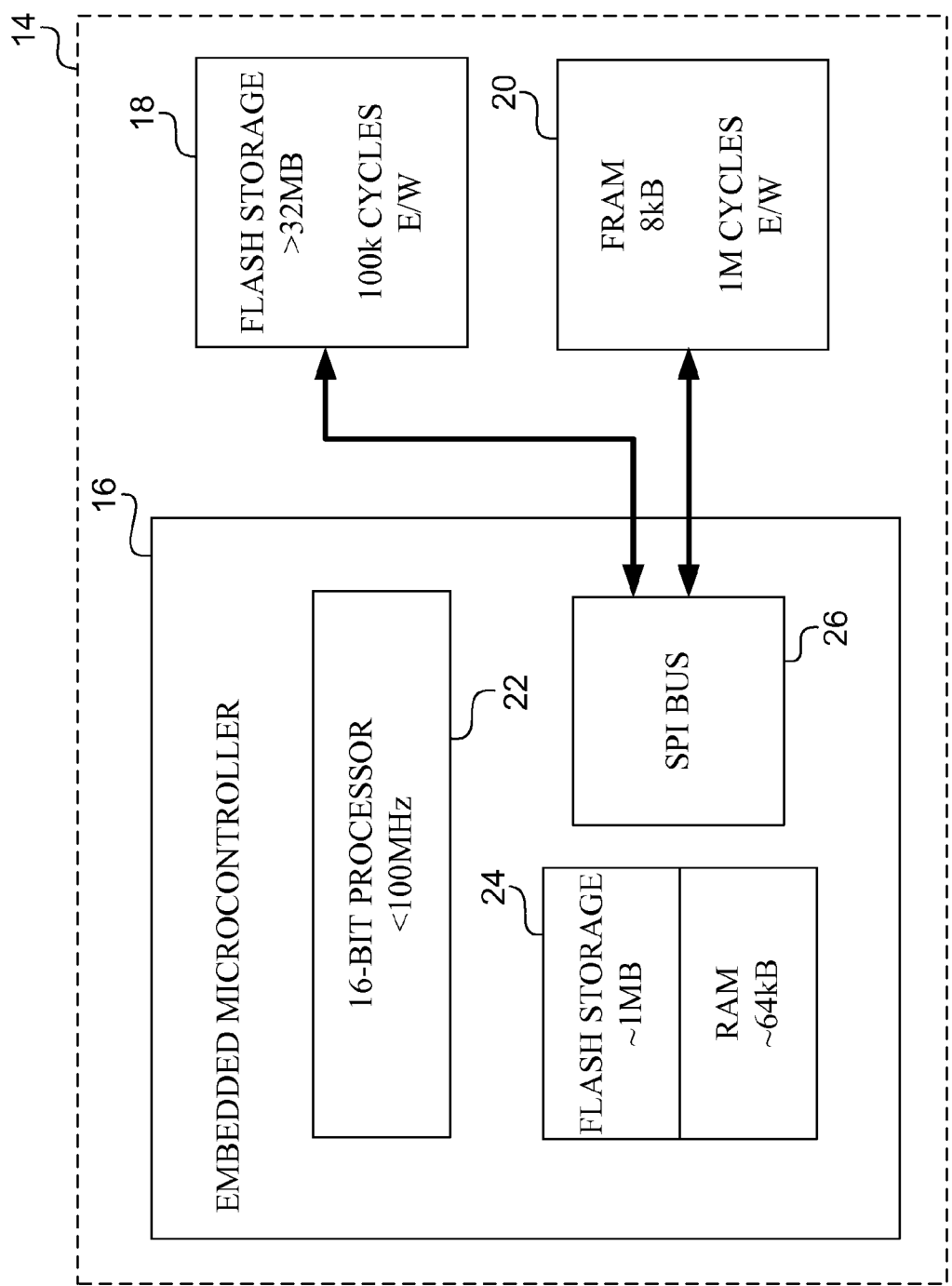
FIG. 3 is a schematical illustration of a control unit utilized in the vehicle of FIG. 2.

Now, additionally referring to FIG. 3, there is schematically illustrated control unit 14, which includes embedded microcontroller 16 that interfaces with memory in the form of flash storage 18 and FRAM 20. Embedded microcontroller 16 includes a processor 22, internal memory 24, and a serial peripheral interface (SPI) bus 26, which interfaces with flash storage 18 and FRAM 20. Microcontroller 16 uses SPI bus 26 to store measured values in flash storage 18. Although flash storage 18 and FRAM 20 are referred to herein for purposes of explaining the invention, they are respectively references to two memory devices, the first having a lower number of E/W cycle life than the second.

Figure 4:
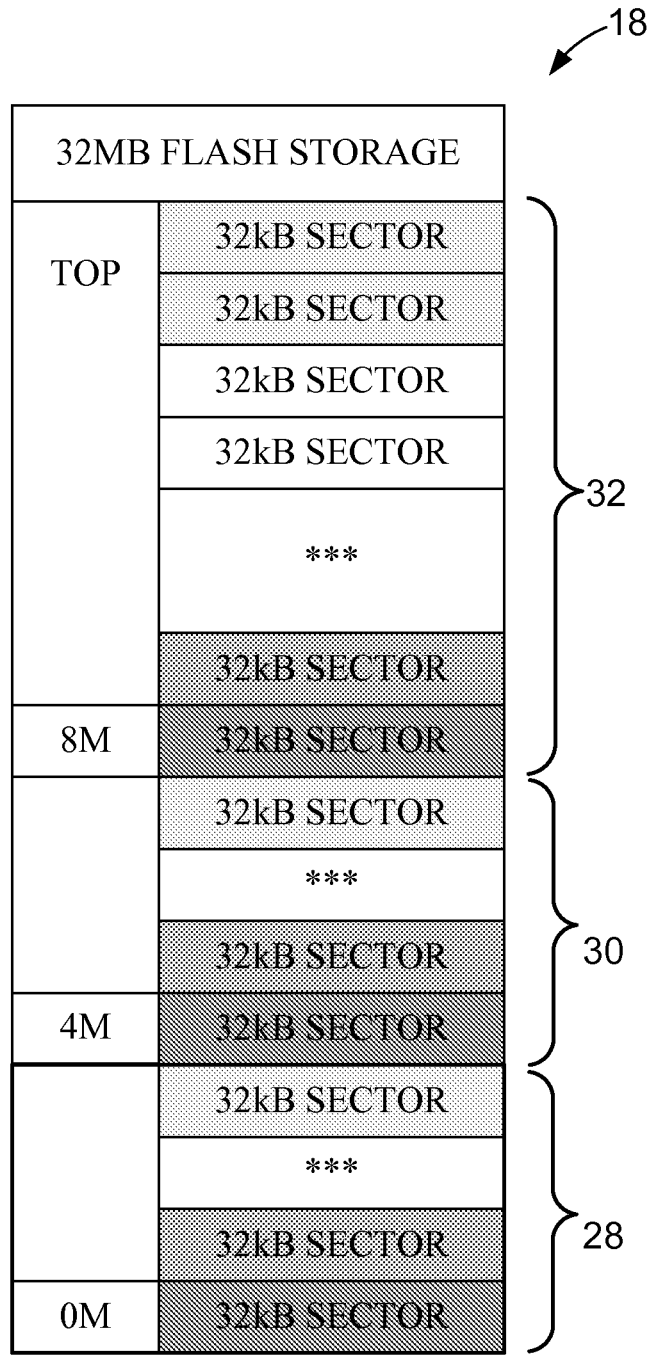
FIG. 4 is a schematical illustration of a flash storage device utilized by the control unit of FIG. 3.

Now, additionally referring to FIG. 4, there is illustrated, in a schematical fashion, the memory capacity of a flash storage 18. For the purposes of explaining the present invention and not as in the form of any limitation in the size thereof, a 32 MB flash storage 18 is utilized having 32 kB sectors, which can be written to numerous times, for example, 100,000 E/W cycles as illustrated in FIG. 3. Flash storage 18 can be thought of as having subsections such as subsection 28 of flash storage 18, which utilizes 4 MB of the 32 MB flash storage 18. The second subsection 30 of flash storage 18 utilizes the next 4 MB section and there are other subsections 32 of flash memory as well. If each subsection of memory is 4 MB, then there are eight subsections in a 32 MB flash storage 18. Again, any references to the sizes are meant for only illustrative purposes and not to limit the scope of the invention.

Looking again at FIG. 3, FRAM 20 may have considerably smaller storage capacity, such as 8 kB but it has the capacity for 1,000,000 E/W cycles. This places the E/W cycles for FRAM 20 at ten times the E/W cycles of flash storage 18.

Now, additionally referring to FIG. 5, control unit 14 is again illustrated showing a specific number of power cycles at 145,680 and the active address range is 2. These numbers or values are stored in FRAM 20. During operation of control unit 14, data that is gathered relative to the performance of energy consuming device 12, or other aspects of vehicle 10, are stored in flash storage 18 in second subsection 30 of flash storage 18. This is determined since the system power cycles exceed 100,000 and first subsection 28 is no longer being written to since the E/W cycles exceed the capacity or longevity for first subsection 28 of flash storage 18. The active address range 2 can be thought of as an offset which directs the low level flash driver software to select second subsection 30 for writing up to 4 MB of data relative to vehicle 10.

Figure 6:
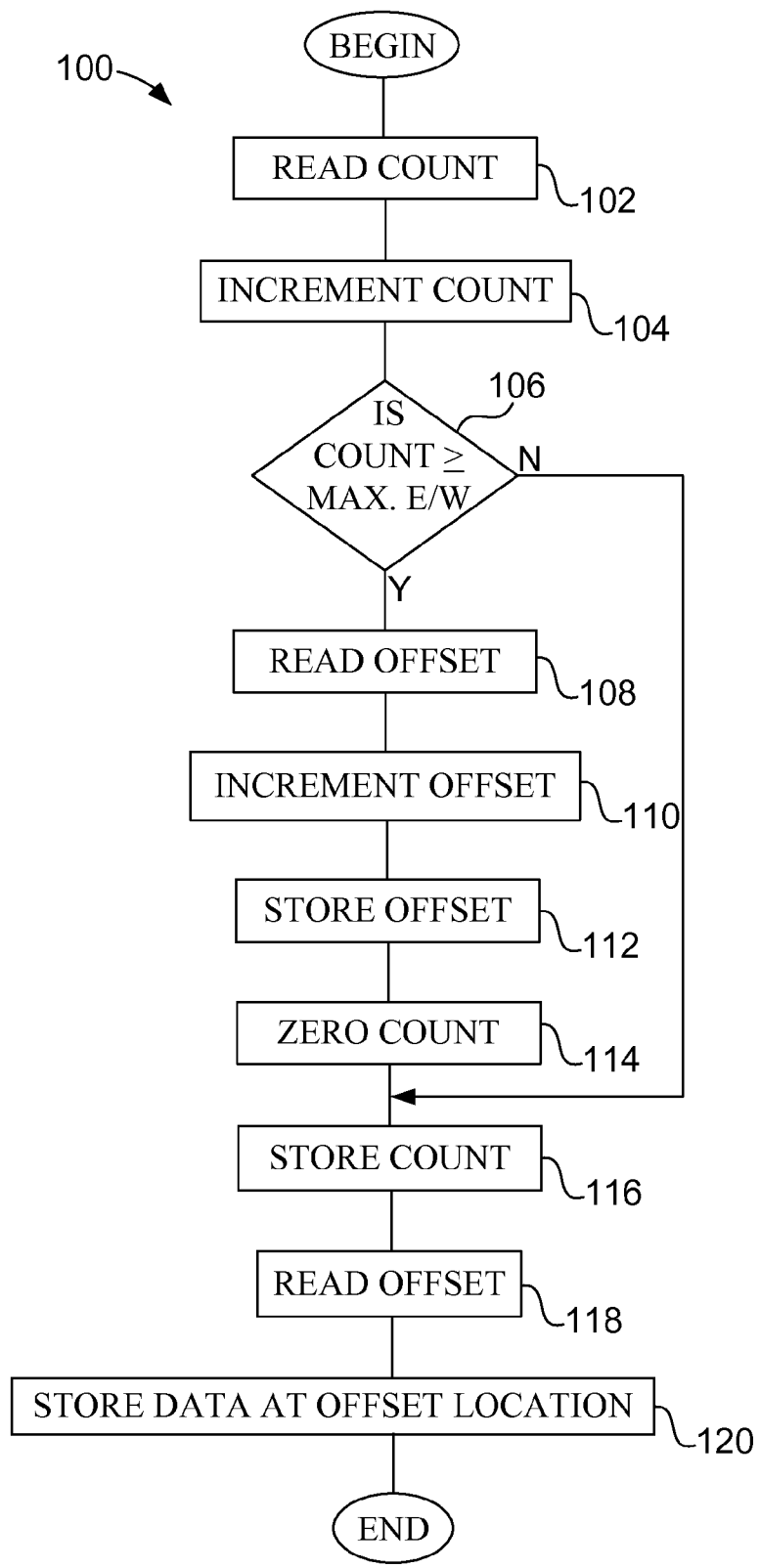
FIG. 6 is a schematical block diagram showing steps to illustrate the function of one embodiment of the present invention.

Now, additionally referring to FIG. 6, there is illustrated one embodiment of a method that is encompassed by the present invention. Method 100 may be initiated at the powering down of vehicle 10 or by other triggering events such as a detected failure, or some other event. Method 100 starts at step 102 where the count of accesses to a specific memory section is read. The count is incremented at step 104 and then, at step 106, a test is undertaken to see if the count is greater than the maximum E/W cycles allowed per subsection. If the count is not greater than the maximum E/W cycles, then method 100 proceeds to step 116. It should be noted that the maximum number of E/W cycles is a predetermined number, which, for the purposes of illustrating the present invention, is set at 100,000 cycles. Another predetermined number, may be selected, for example, 95,000 to provide a safety margin below the 100,000 rated value for flash storage 18. It should also be noted that FRAM 20 has a limited endurance expressed as the number of E/W cycles, such as 1,000,000 E/W cycles, which is, in this example, ten times the capability of flash storage 18.

Figure 5:
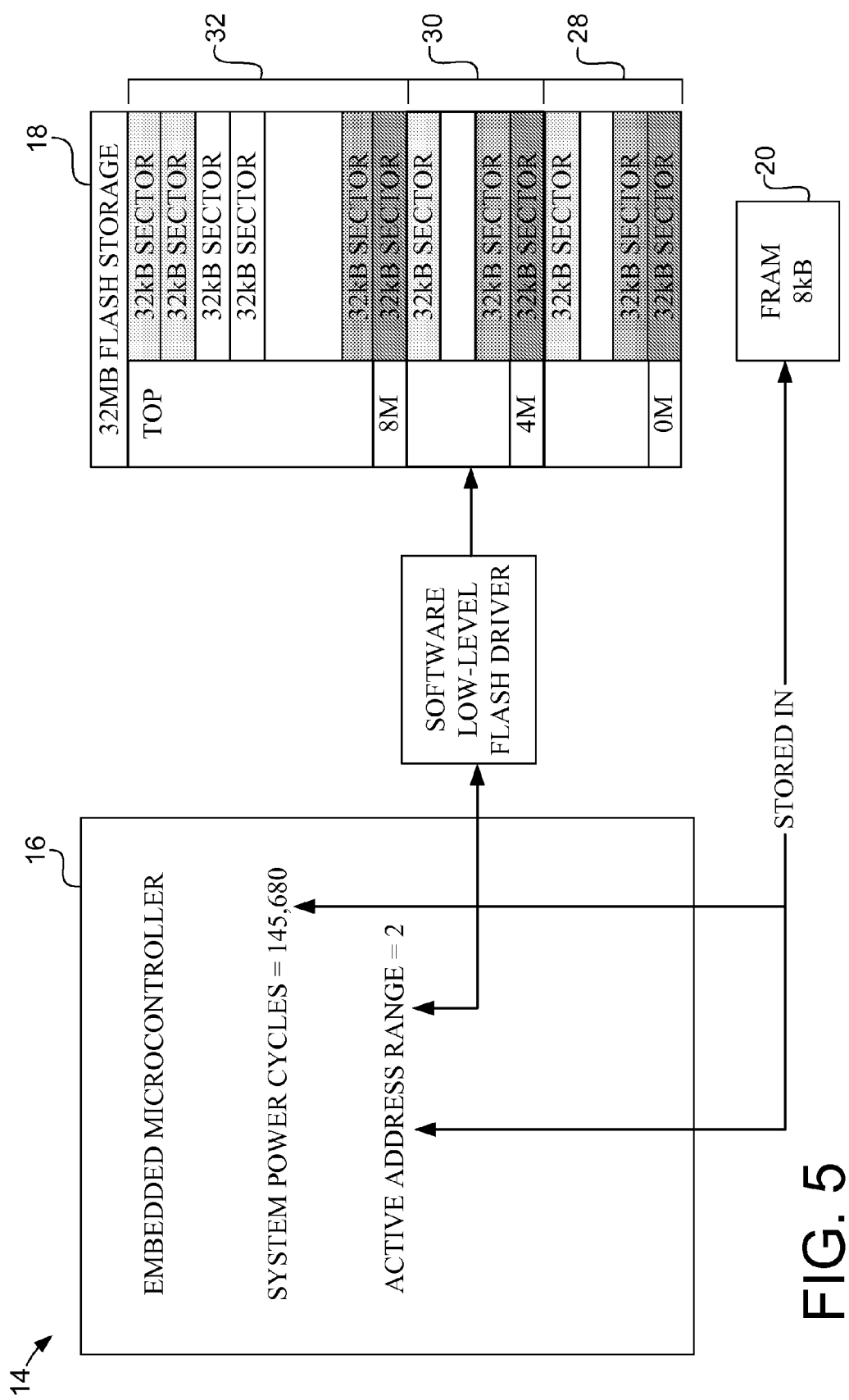
FIG. 5 is a schematical illustration of how the method utilized by the present invention in FIGS. 2-4 is carried out.

At step 116, method 100 stores the incremented count in FRAM 20 and reads the offset at step 118, which is illustrated in FIG. 5 as being the active address range having a value of 2. The data from energy consuming device 12 and/or vehicle 10 is stored at the offset location at step 120, and in the example of FIG. 5, this is in second subsection 30.

If, at step 106 the count is greater than or equal to the maximum E/W cycles (which is the predetermined number), then the offset contained in FRAM 20 is read at step 108 and the offset is incremented at step 110 and stored at step 112. This effectively selects a new subsection of flash storage 18 for the next write cycle. In this example, the count is zeroed at step 114, which is the count of the number of E/W cycles the new subsection has been written to. Then, method 100 proceeds to step 116 as previously discussed.

Although the above discussed method uses a count variable it is also contemplated to use a mathematical operation to determine the subsection of memory that is currently active. For example, a truncated division operation can be used, which for example, if the system power cycles=143,680, as in FIG. 5, then 143,680 div 95,000=1. The resulting value of 1 indicates that the count is at least 95,000, but less than 190,000, so the second subsection of memory is to be written to.

Advantageously, the present invention combines the high capacity of flash storage 18 with the high erase/write endurance of FRAM 20, which is leveraged by a low level flash drive or software routine, which is utilized to carry out the functions as described herein. This configuration is highly useful for effective low cost prognostic data storage in a vehicle 10. The RAM of memory 24 serves as a temporary holding area for the data or values intended for nonvolatile storage in flash storage 18. The information is copied to flash storage 18 at power down, which induces an erase/write cycle in the targeted sectors, which, as in this example, is subsection 30 of flash storage 18. The count value counts the number of power cycles, which is then written to FRAM 20 at power down.

In the foregoing example, the 32 MB flash storage 18 is treated as eight-4 MB devices. Initially, only data is stored in flash sectors residing in first subsection 28, which are between the OMB and 4 MB address range. When the total power cycles reach the predetermined number of flash sector endurance, a different range of physical addresses are targeted, as in this example, subsection 30, with the active range of addresses now being between 4 MB and 8 MB in flash storage 18. The active address range is stored in FRAM 20, effectively providing an offset depending on the number of system power cycles. Advantageously, prognostic data is saved on flash storage 18 and provides some snapshot of data history, due to leaving the data in the sectors that are being treated as exhausted.

The threshold of power cycles that triggers the switch in address range between one subsection of memory and another subsection of memory should provide a margin for life expectancy of this sector life. As noted above, a threshold may be in the neighborhood of 95,000 E/W cycles if the device is rated at 100K E/W cycles.

In the foregoing example, if only 4 MB of prognostic storage is required, the 32 MB part, which is utilized to emulate a 4 MB device with 760,000 E/W cycles can be readily utilized in a low cost/high capacity memory storage device that has been qualified for vehicular/automotive applications. It should be noted that the capability of FRAM 20, of course, must be higher than the emulated E/W cycles of flash storage 18, otherwise, the emulated flash storage device endurance is restricted to the maximum number of FRAM E/W cycle endurance.

It is also contemplated that the total number of system power cycles may be stored without storing the address range and the address range can then be computed each time it is needed dependent upon the total number of system power cycles that have taken place. It is also contemplated to use the technique directed toward the flash memory with the FRAM memory to extend its' function as well.

Advantageously, the present invention provides for a low cost/high capacity device that will meet the rigors of the vehicular environment.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A memory management method, comprising the steps of:
   storing, via a controller embedded in a vehicle, a power cycle value representative of a number of power cycles that a first subset of memory space of a first memory has undergone, said first memory having an assigned predetermined maximum number of erase/write cycles, wherein said power cycle value is stored in a second memory that has an assigned predetermined maximum number of erase/write cycles which is larger than said predetermined maximum number of said first memory;
   writing, via said controller, data to said first subset of memory space dependent upon whether said power cycle value is below said predetermined maximum number; and
   storing, via said controller, in said second memory, a location value representative of a memory location of said first memory at which data is currently being stored;
   wherein said first and second memories are external to said controller and are embedded in said vehicle;
   wherein said first subset of memory space includes multiple memory sectors having a first range of addresses;
   wherein said writing step includes writing data to a new subset of memory space if said power cycle value is one of equal to and greater than said predetermined maximum number;
   wherein said new subset of memory space includes multiple memory sectors having a second range of addresses different from said first range of addresses; and
   wherein when said data written to said new subset of memory space is different from historical data previously written to said first subset of memory space, and said historical data is preserved in said first subset of memory space.

2. The method of claim 1, further comprising the step of storing an offset value which is used to determine a memory location of said first memory at which data can be stored.

3. The method of claim 2, wherein said offset value is stored in said second memory.

4. An electrical control system, comprising:
   a control unit having, a microcontroller embedded in a vehicle, a first memory and a second memory, said first memory and said second memory being in communication with said microcontroller and embedded in said vehicle, said control unit using a memory management method that includes the steps of:
   storing, in said second memory, a power cycle value representative of a number of power cycles that a first subset of memory space of said first memory has undergone, said first memory having an assigned predetermined maximum number of erase/write cycles;
   writing data to said first subset of memory space dependent upon whether said power cycle value is below said predetermined maximum number; and
   storing, in said second memory, a location value representative of a memory location of said first memory at which data is currently being stored;
   wherein said second memory has an assigned predetermined maximum number of erase/write cycles which is larger than said predetermined maximum number of said first memory;
   wherein said first and second memories are external to said microcontroller;
   wherein said first subset of memory space includes multiple memory sectors having a first range of addresses;
   wherein said writing step includes writing data to a new subset of memory space if said power cycle value is one of equal to and greater than said predetermined maximum number;
   wherein said new subset of memory space includes multiple memory sectors having a second range of addresses different from said first range of addresses; and
   wherein when said data written to said new subset of memory space is different from historical data previously written to said first subset of memory space, and said historical data is preserved in said first subset of memory space.

5. The electrical control system of claim 4, wherein the method further comprises the step of storing an offset value which is used to determine a memory location of said first memory at which data can be stored, said offset value being stored in said second memory.

6. An energy consuming device, comprising:
   at least one performance measuring device that produces at least one measured value;
   a first memory device; a second memory device; and
   a controller communicatively coupled to the energy consuming device, said controller being in communication with said first memory device and said second memory device, which memory devices are external to said controller, said at least one measured value being stored in a first selected location in said first memory device, said first memory device having an assigned predetermined maximum number of erase/write cycles, said first selected location being changed to a new selected location once said first memory device has undergone a count of power cycles that is equal to said predetermined maximum number of erase/write cycles, said second memory device containing said count;

wherein said second memory device has an assigned predetermined maximum number of erase/write cycles that exceeds said predetermined maximum number of erase/write cycles of said first memory device;

wherein a location value representative of said first selected location and an offset value are stored in said second memory, said offset value being used to determine a memory location of said first memory device at which said at least one measured value is stored;

wherein the energy consuming device is configured to power a vehicle and said controller and said first and second memory devices are embedded in said vehicle;

wherein said first selected location includes multiple memory sectors having a first range of addresses;

wherein said new selected location includes multiple memory sectors having a second range of addresses different from said first range of addresses; and wherein said data written to said new selected location is different from historical data previously written to said first selected location, and said historical data is preserved in said first selected location.

7. The energy consuming device of claim 6, wherein said second memory device has an assigned predetermined maximum number of erase/write cycles that is more than ten times said predetermined maximum number of erase/write cycles of said first memory device.

\* \* \* \* \*